(12) United States Patent
Luo et al.

(10) Patent No.: US 11,728,895 B2
(45) Date of Patent: Aug. 15, 2023

(54) OPTICAL COMMUNICATION MODULE WITH CIRCUIT BOARD COMPATIBLE WITH HEMETICAL/NON-HEMETICAL PACKAGING AND OPTICAL TRANSCEIVER HAVING THE SAME

(71) Applicant: Global Technology Inc., Ningbo (CN)

(72) Inventors: Jian-Hong Luo, Ningbo (CN); Dong-Biao Jiang, Ningbo (CN); Qilin Hong, Ningbo (CN); Taotao Ye, Ningbo (CN)

(73) Assignee: Global Technology Inc., Ningbo (CN)

( * ) Notice: Subject to any disclaimer, the term of this patent is extended or adjusted under 35 U.S.C. 154(b) by 0 days.

(21) Appl. No.: 17/329,868

(22) Filed: May 25, 2021

(65) Prior Publication Data

US 2022/0255626 A1 Aug. 11, 2022

(30) Foreign Application Priority Data

Feb. 9, 2021 (CN) .......................... 202110174221.0

(51) Int. Cl.
| | | |
|---|---|---|
| *H04B 10/00* | (2013.01) | |
| *H04B 10/40* | (2013.01) | |
| *H05K 1/11* | (2006.01) | |
| *G02B 6/42* | (2006.01) | |

(52) U.S. Cl.
CPC ............. *H04B 10/40* (2013.01); *G02B 6/428* (2013.01); *H05K 1/117* (2013.01)

(58) Field of Classification Search
CPC .... G02B 6/4251; H05K 1/117; H05K 5/0095; H05K 5/06; H04B 10/40
See application file for complete search history.

(56) References Cited

U.S. PATENT DOCUMENTS

| | | | | |
|---|---|---|---|---|
| 10,313,024 | B1* | 6/2019 | Ho ......................... | H04B 10/80 |
| 10,416,400 | B2* | 9/2019 | Yamauchi ............. | H01S 5/0265 |
| 2005/0047730 | A1* | 3/2005 | Ellison ................. | G02B 6/4292 |
| | | | | 385/92 |
| 2005/0286839 | A1* | 12/2005 | Yoshikawa .......... | G02B 6/4201 |
| | | | | 385/92 |

(Continued)

FOREIGN PATENT DOCUMENTS

JP 2016004989 A * 1/2016

*Primary Examiner* — Pranesh K Barua
(74) *Attorney, Agent, or Firm* — Grossman Tucker Perreault & Pfleger, PLLC

(57) ABSTRACT

Related to an optical communication module, the optical communication module comprises a main body, an optical communication assembly and a second circuit board. The main body comprises a housing and a first circuit board disposed on the housing. The housing and the first circuit board together form an airtight cavity of the main body, and the first circuit board comprises two first electric interfaces. The optical communication assembly is accommodated in the airtight cavity and comprises a substrate, an optical communication element and a second electric interface. The optical communication element disposed on the substrate. One of the two first electric interfaces of the first circuit board is electrically connected to the second electric interface. The second circuit board comprises a third electric interface and the other one of the two first electric interfaces of the first circuit board is electrically connected to the third electric interface.

10 Claims, 9 Drawing Sheets

(56) References Cited

U.S. PATENT DOCUMENTS

| | | | |
|---|---|---|---|
| 2018/0149818 A1* | 5/2018 | Yamauchi | H01S 5/02251 |
| 2020/0285008 A1* | 9/2020 | Lin | G02B 6/1226 |
| 2021/0014961 A1* | 1/2021 | He | H05K 1/0295 |

* cited by examiner

OPTICAL COMMUNICATION MODULE WITH CIRCUIT BOARD COMPATIBLE WITH HEMETICAL/NON-HEMETICAL PACKAGING AND OPTICAL TRANSCEIVER HAVING THE SAME

CROSS-REFERENCE TO RELATED APPLICATIONS

This non-provisional application claims priority under 35 U.S.C. § 119(a) on Patent Application No(s). 202110174221.0 filed in China on Feb. 9, 2021, the entire contents of which are hereby incorporated by reference.

BACKGROUND

1. Technical Field

This disclosure relates to an optical transceiver, in particular, an optical communication module of an optical transceiver which includes circuit board having specific pin assignment.

2. Related Art

In modern high-speed communication networks, optical transceivers are generally installed in electronic communication facilities. In order to make flexible design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), or others at different communication rates have been made available.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
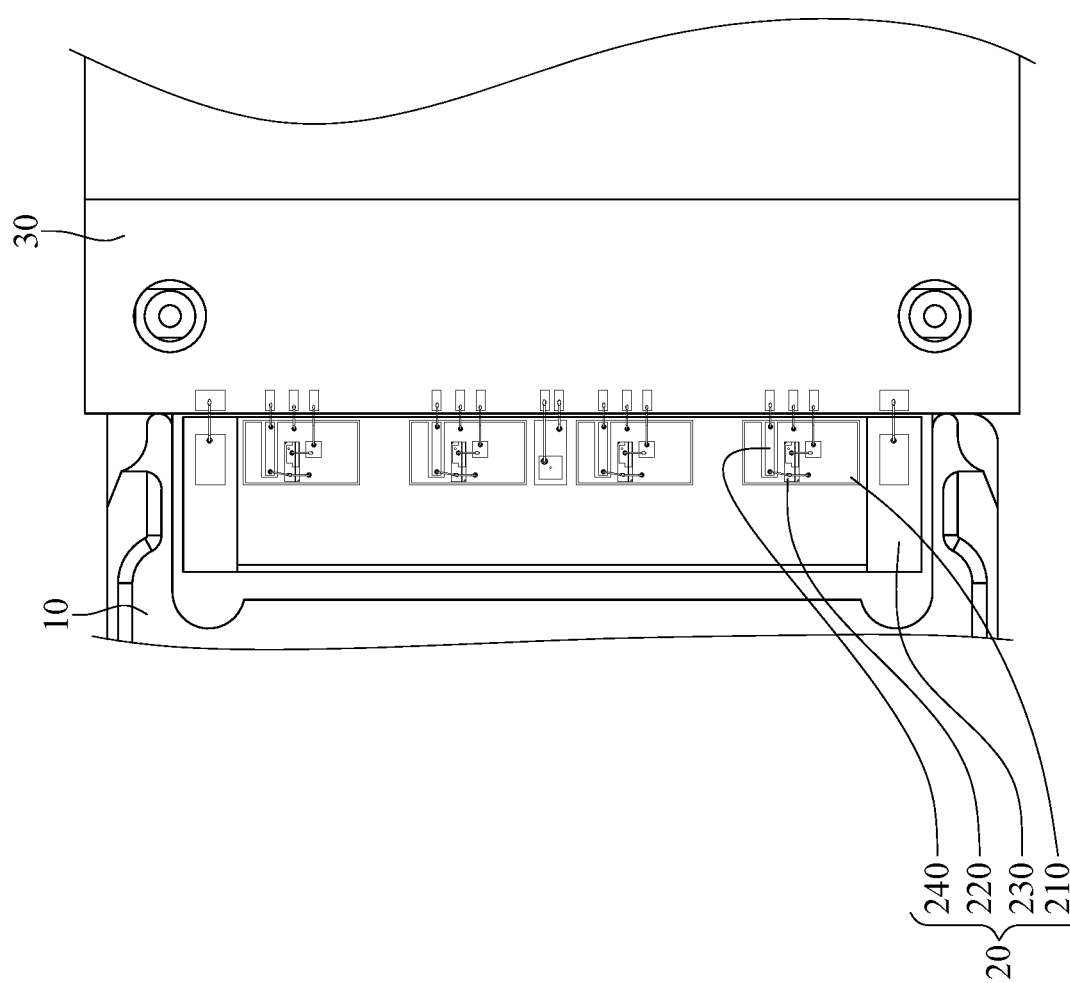
FIG. 1 is a top view of an optical communication module according to an embodiment of the present disclosure.
Figure 2:
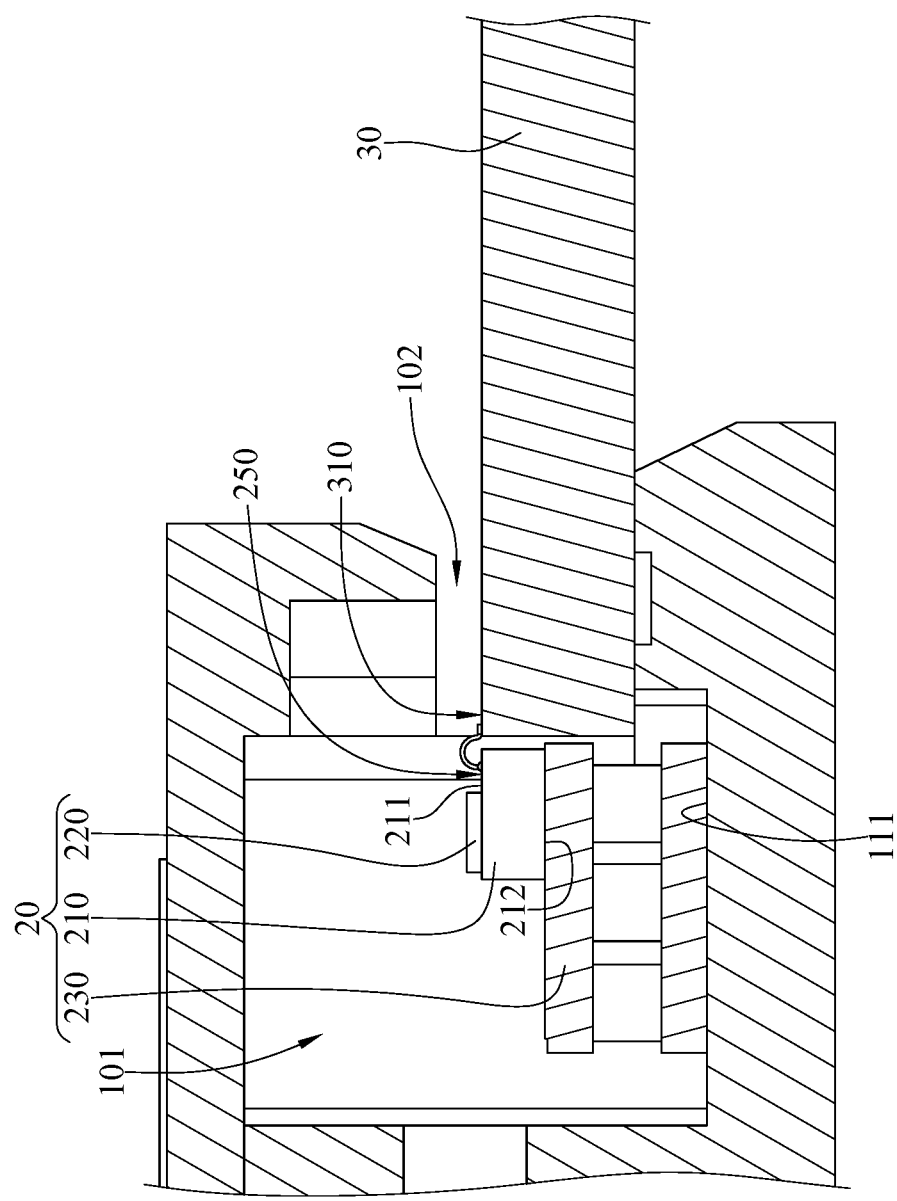
FIG. 2 is an internal side view of the optical communication module in FIG. 1.
Figure 3:
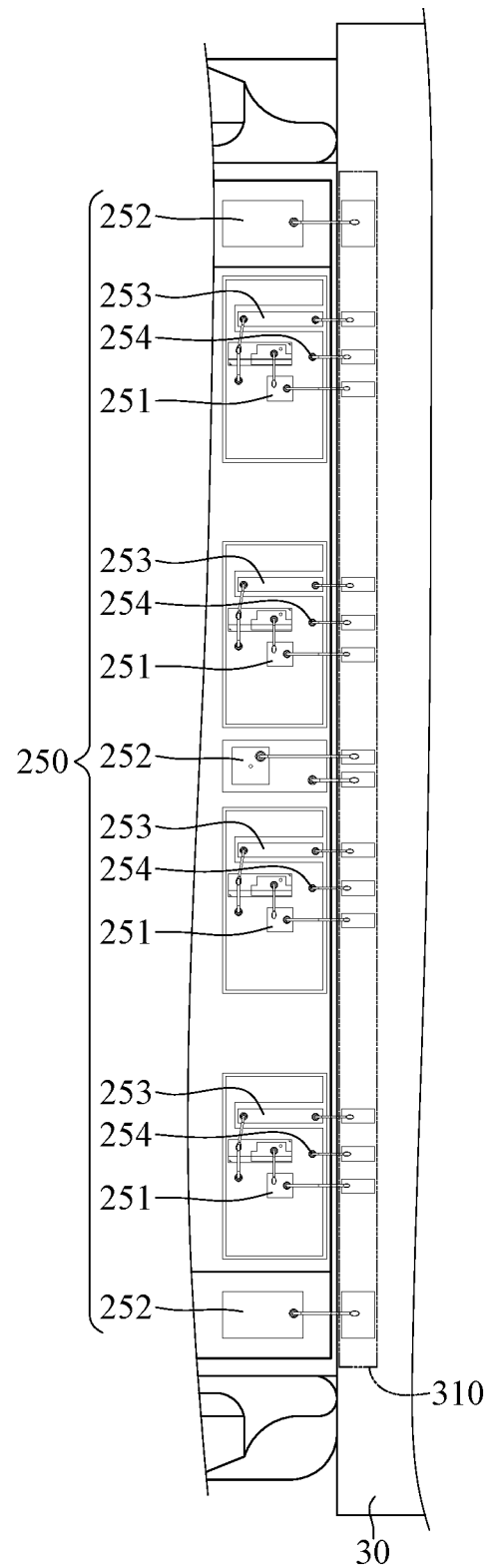
FIG. 3 is an enlarged view of part of the optical communication module in FIG. 1.

Please refer to FIG. 1 to FIG. 3. FIG. 1 is a top view of an optical communication module according to an embodiment of the present disclosure, FIG. 2 is an internal side view of the optical communication module in FIG. 1, and FIG. 3 is an enlarged view of part of the optical communication module in FIG. 1. In the present embodiment, the optical communication module 1a includes a main body 10, an optical communication assembly 20 and a circuit board 30. The main body 10 is, for example, but not limited to a metal shell for package having a cavity 101 and an opening 102 connected to each other. To better illustrate the present disclosure, a part of the top of the main body 10 is omitted in FIG. 1 and FIG. 3 for showing the optical communication assembly 20 located in the main body 10.

The optical communication assembly 20 is accommodated in the cavity 101 of the main body 10, and the optical communication assembly 20 includes a substrate 210, an optical communication element 220, a temperature controller 230, an optical modulator 240 (FIG. 4) and an electric interface 250. The substrate 210 is, for example, but not limited to a printed circuit board. The optical communication element 220 is disposed on an upper surface 211 of the substrate 210, and the optical communication element 220 may be a light emitting diode, a photodiode, a transmitter optical subassembly (TOSA), receiver optical subassembly (ROSA), or a package thereof. The optical communication element 220 may be electrically connected to an integrated circuit chip (for example, a digital signal processor not drawn in the drawings), and thus the optical communication element 220 can convert and output electric signals from the integrated circuit chip into corresponding optical signals, or receive and convert the optical signals into the corresponding electric signals through the integrated circuit chip. It is worth noting that the optical communication assembly 20 of the present disclosure may include multiple substrates 210 and multiple optical communication elements 220.

The temperature controller 230 is, for example, but not limited to a thermocouple temperature controller. The temperature controller 230 is accommodated in the cavity 101 of the main body 10 and is in thermal contact with the substrate 210 of the optical communication assembly 20. More particularly, the temperature controller 230 is disposed between a lower surface 212 of the substrate 210 and a bottom inner wall surface 111 of the main body 10, and opposite sides of the temperature controller 230 are respectively in thermal contact with the lower surface 212 of the substrate 210 and the bottom inner wall surface 111 of the main body 10. In one implementation, the optical communication element 220 and the temperature controller 230 are respectively disposed on opposite surfaces (upper surface and lower surface) of the substrate 210. The temperature controller 230 is to control the working temperature inside the main body 10 within a certain range suitable for operation. The optical modulator 240 is disposed on the substrate 210 and is electrically connected to the optical communication element 220.

The electric interface 250 in FIG. 3, for example, may be a plurality of pins (such as multiple conducting wires or metal contact pads) located on the substrate 210, the optical communication element 220 or the temperature controller 230 of the optical communication assembly 20. In detail, the electric interface 250 includes various types of pins such as an optical communication element pin 251, temperature controller pin 252, modulator pin 253 and ground pin 254 (ground point). The optical communication element pin 251 and the ground pin 254 are connected to the optical communication element 220. The temperature controller pin 252 is connected to the temperature controller 230, and the modulator pin 253 is connected to the optical modulator 240. As shown in FIG. 3, multiple optical communication pins 251, temperature controller pins 252, modulator pins 253, and ground pins 254 are present. The number of those pins might vary from one implementation to another implementation.

The circuit board 30 extends into the cavity 101 of the main body 10 through the opening 102. The circuit board 30 includes an electric interface 310 connected to the electric interface 250. The circuit board 30 may supply power to the optical communication element 220, the temperature controller 230 and the optical modulator 240 through the electric interface 250 and the electric interface 310.

Figure 4:
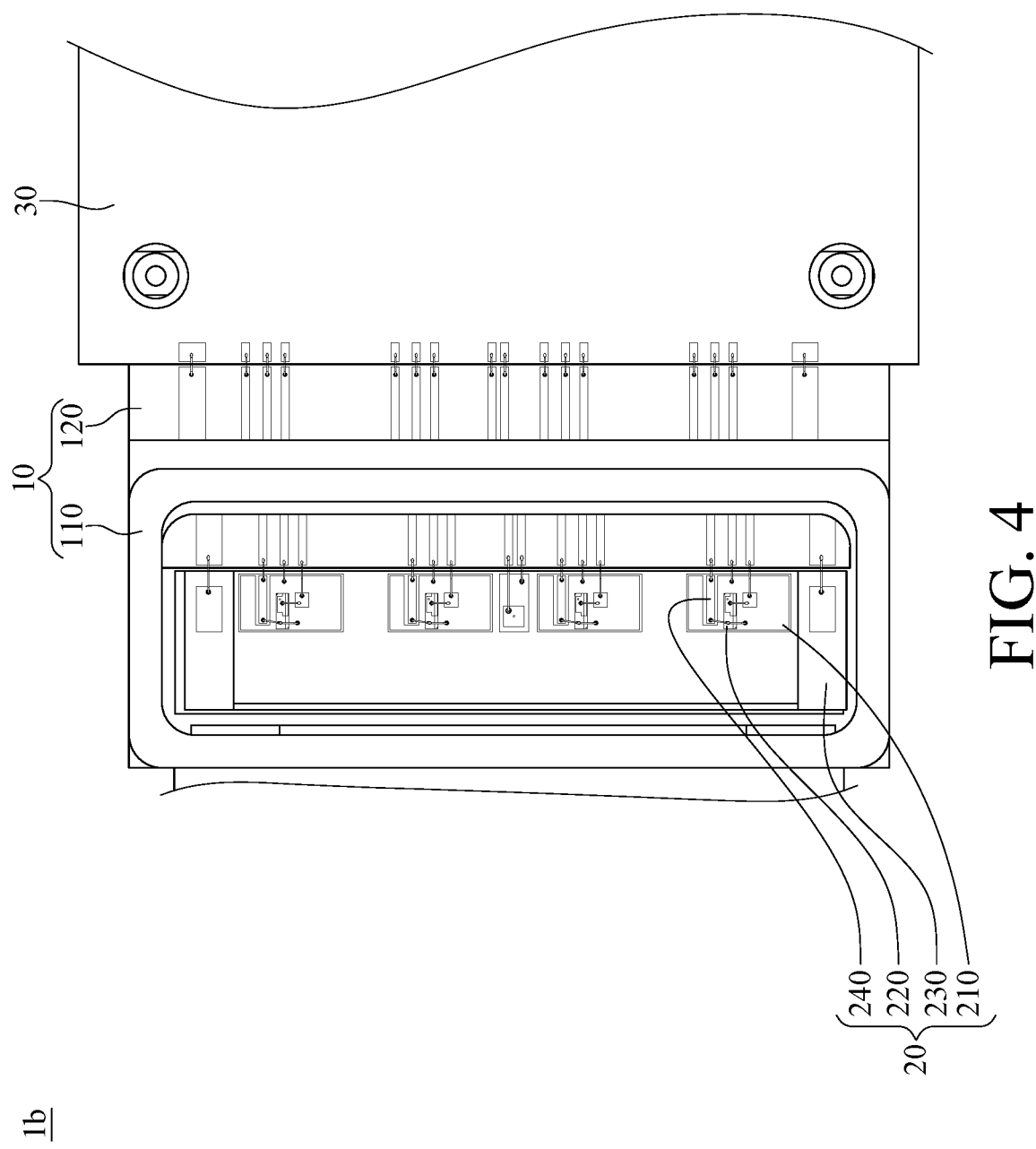
FIG. 4 is a top view of an optical communication module according to another embodiment of the present disclosure.
Figure 5:
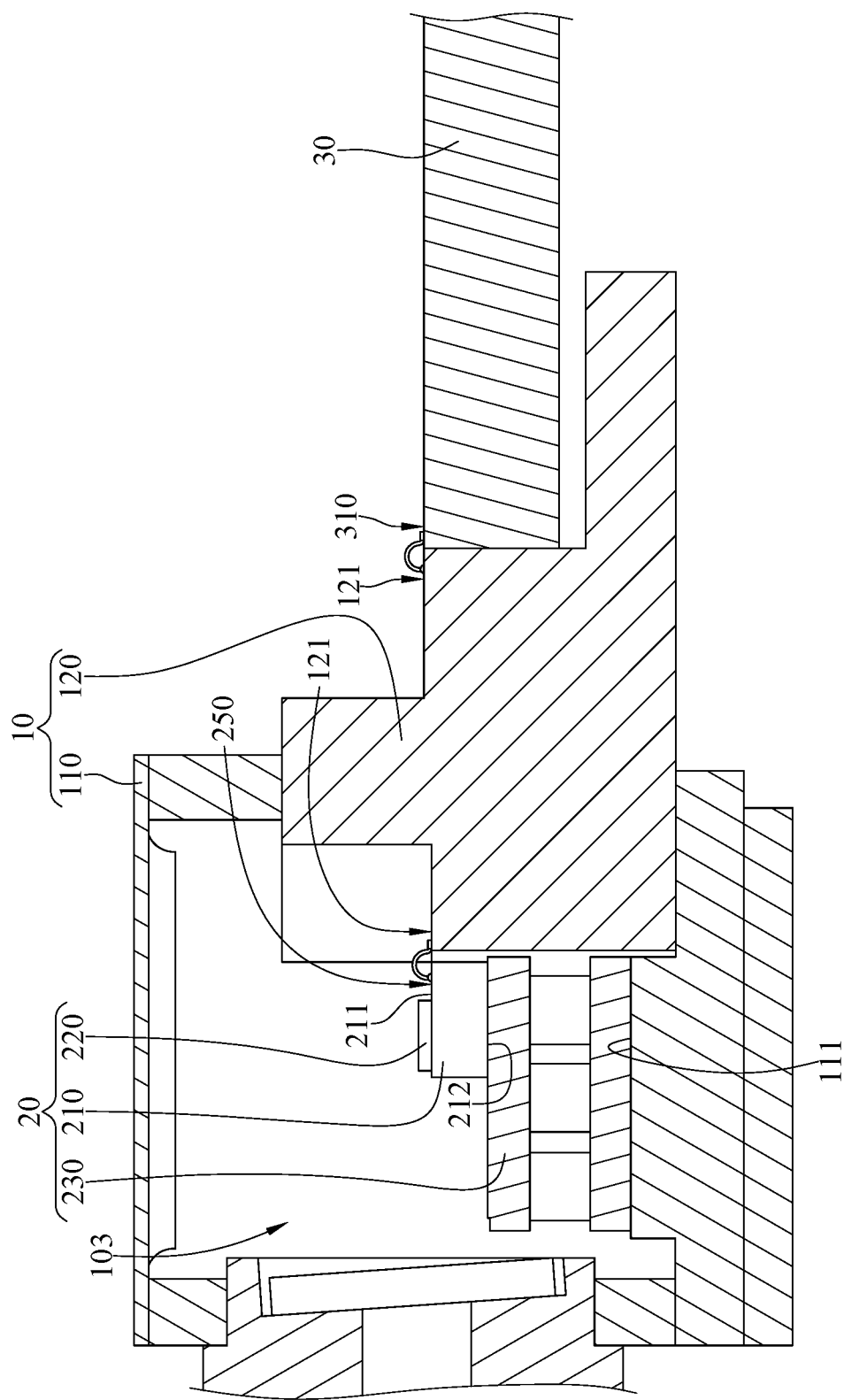
FIG. 5 is an internal side view of the optical communication module in FIG. 4.
Figure 6:
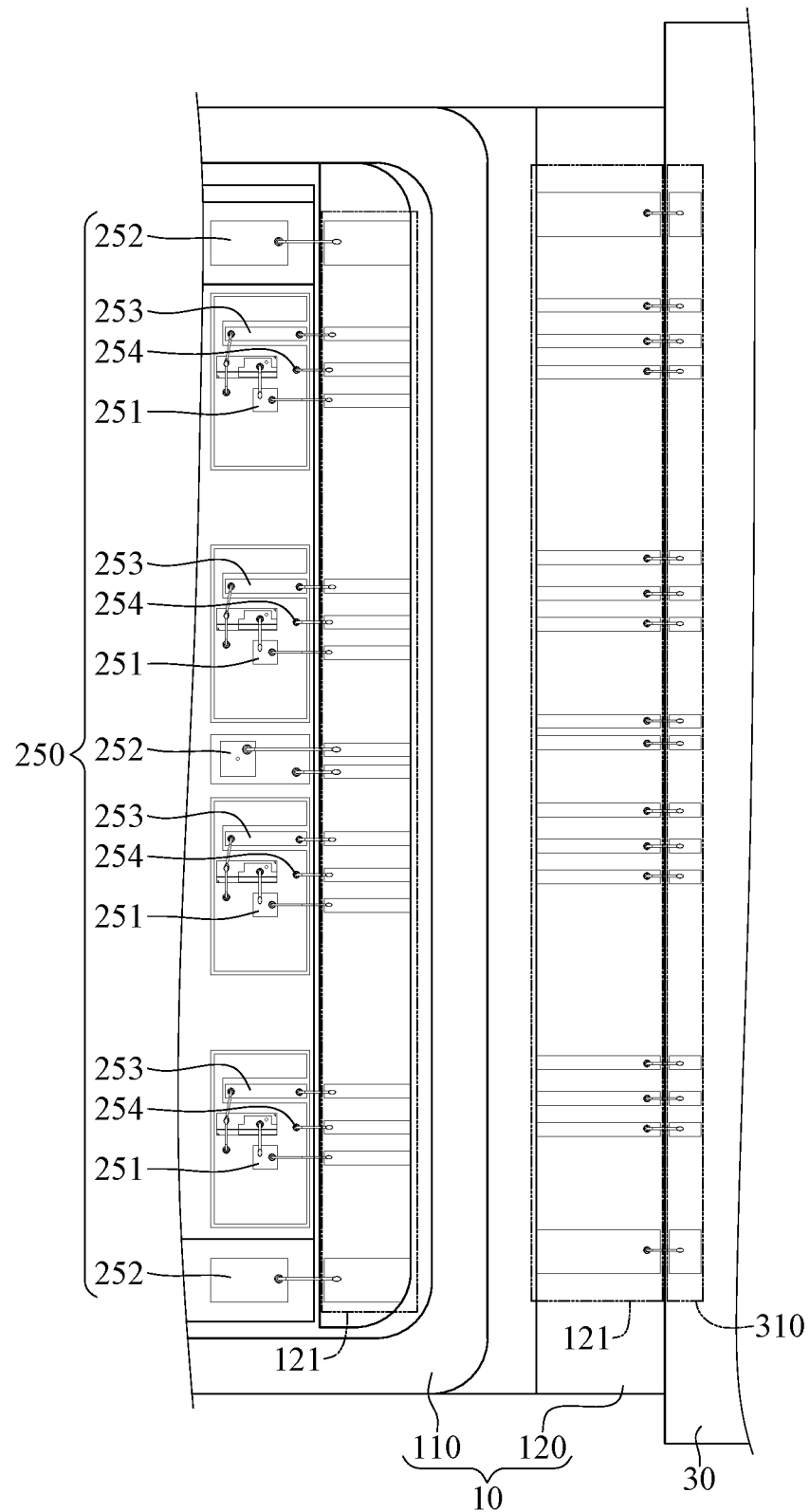
FIG. 6 is an enlarged view of part of the optical communication module in FIG. 4.

The opening 102 of the optical communication module 1a in FIG. 2 allows the cavity 101 to be spatially communicated with external environment, and this configuration could be found an optical communication module with non-hermetically sealing packaging. On the other hand, a hermetically sealing optical communication module would be with different configurations. Please refer to FIG. 4 to FIG. 6. FIG. 4 is a top view of an optical communication module according to another embodiment of the present disclosure, FIG. 5 is an internal side view of the optical communication module in FIG. 4, and FIG. 6 is an enlarged view of part of the optical communication module in FIG. 4. In the present embodiment, the optical communication module 1b includes a main body 10, an optical communication assembly 20 and a circuit board 30. The main body 10 includes a housing 110 and a circuit board 120 disposed on the housing 110. The housing 110 is, for example, but not limited to a metal shell for package, and the circuit board 120 is, for example but not limited to, a ceramic circuit board. The housing 110 and the circuit board 120 together provides an airtight cavity 103, and the circuit board 120 includes two electric interfaces 121. The airtight cavity 103 can prevent air, water or other foreign objects at the external environment from entering into the main body 10. The high heat resistance of the ceramic circuit board (the circuit board 120) allows for the optical communication module 1b to be suitable for harsh outdoor environment. To better understand the present disclosure, a part of the top of the housing 110 is omitted in FIG. 4 and FIG. 6 for showing the optical communication assembly 20 located in the main body 10.

The optical communication assembly 20 is accommodated in the airtight cavity 103 in the main body 10, and the optical communication assembly 20 includes a substrate 210, an optical communication element 220, a temperature controller 230, an optical modulator 240 and an electric interface 250. The substrate 210 is, for example but not limited to, a printed circuit board. The optical communication element 220 is disposed on an upper surface 211 of the substrate 210, and the optical communication element 220 may be a light emitting diode, a photodiode, a transmitter optical subassembly, receiver optical subassembly, or package thereof. The optical communication element 220 may be electrically connected to an integrated circuit chip (for example, a digital signal processor not drawn in the drawings), and thus the optical communication element 220 may convert and output electric signals from the integrated circuit chip into corresponding optical signals, or receive and convert the optical signals into the corresponding electric signal through the integrated circuit chip. FIG. 4 shows that the optical communication assembly 20 includes a plurality of substrates 210 and a plurality of optical communication elements 220. As with the previous discussion, the number of the substrates 210 and the number of the optical communication elements 220 might vary from one embodiment to another embodiment.

The temperature controller 230 is, for example but not limited to, a thermocouple temperature controller. The temperature controller 230 is accommodated in the airtight cavity 103 of the main body 10 and is in thermal contact with the substrate 210 of the optical communication assembly 20. More particularly, the temperature controller 230 is disposed between a lower surface 212 of the substrate 210 and a bottom inner wall surface 111 of the main body 10, and opposite sides of the temperature controller 230 are respectively in thermal contact with the lower surface 212 of the substrate 210 and the bottom inner wall surface 111 of the main body 10. In other words, the optical communication element 220 and the temperature controller 230 are respectively disposed on opposite surfaces of the substrate 210. The temperature controller 230 is to help control the working temperature inside the main body 10 within a certain range suitable for operation. The optical modulator 240 is disposed on the substrate 210 and is electrically connected to the optical communication element 220.

The electric interface 250, for example, may be including a plurality of pins (such as conducting wires or a metal contact pads) located on the substrate 210, the optical communication element 220 or the temperature controller 230 of the optical communication assembly 20. The electric interface 250 includes various types of pin such as optical communication element pins 251, temperature controller pins 252, modulator pins 253 and ground pins 254. The optical communication element pin 251 and the ground pin 254 are connected to the optical communication element 220. The temperature controller pin 252 is connected to the temperature controller 230, and the modulator pin 253 is connected to the optical modulator 240. It is worth noting that the protective scope of the present disclosure is not limited to the numbers of these types of pins and their relative positions.

The circuit board 30 has an electric interface 310. One of the electric interfaces 121 of the circuit board 120 of the main body 10 is electrically connected to the electric interface 310, and the other electric interface 121 is electrically connected to the electric interface 250. The circuit board 30 may supply power to the optical communication element 220, the temperature controller 230 and the optical modulator 240 through the electric interface 121, the electric interface 250 and the electric interface 310.

Figure 7:
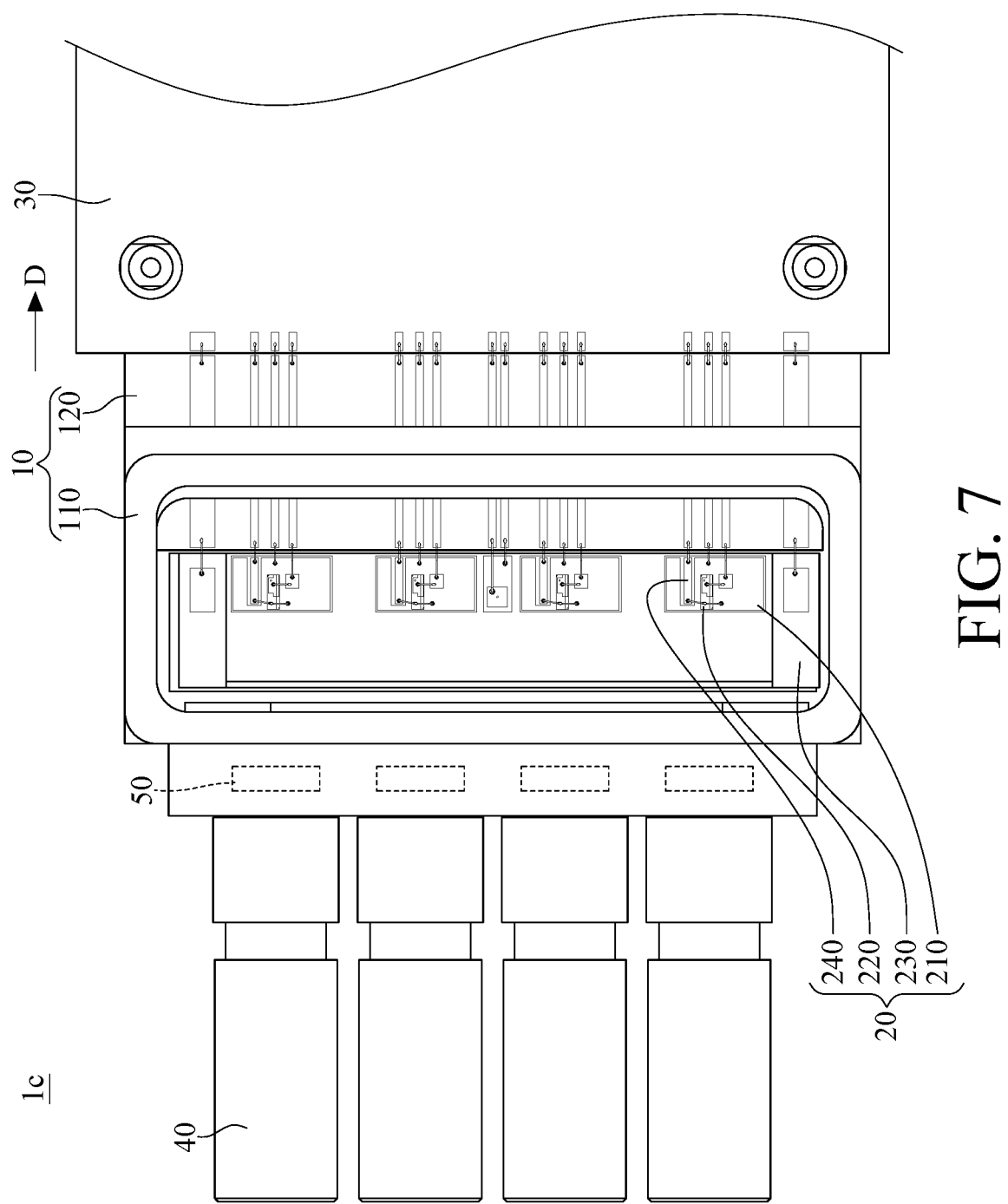
FIG. 7 is a top view of an optical communication module according to still another embodiment of the present disclosure.
Figure 8:
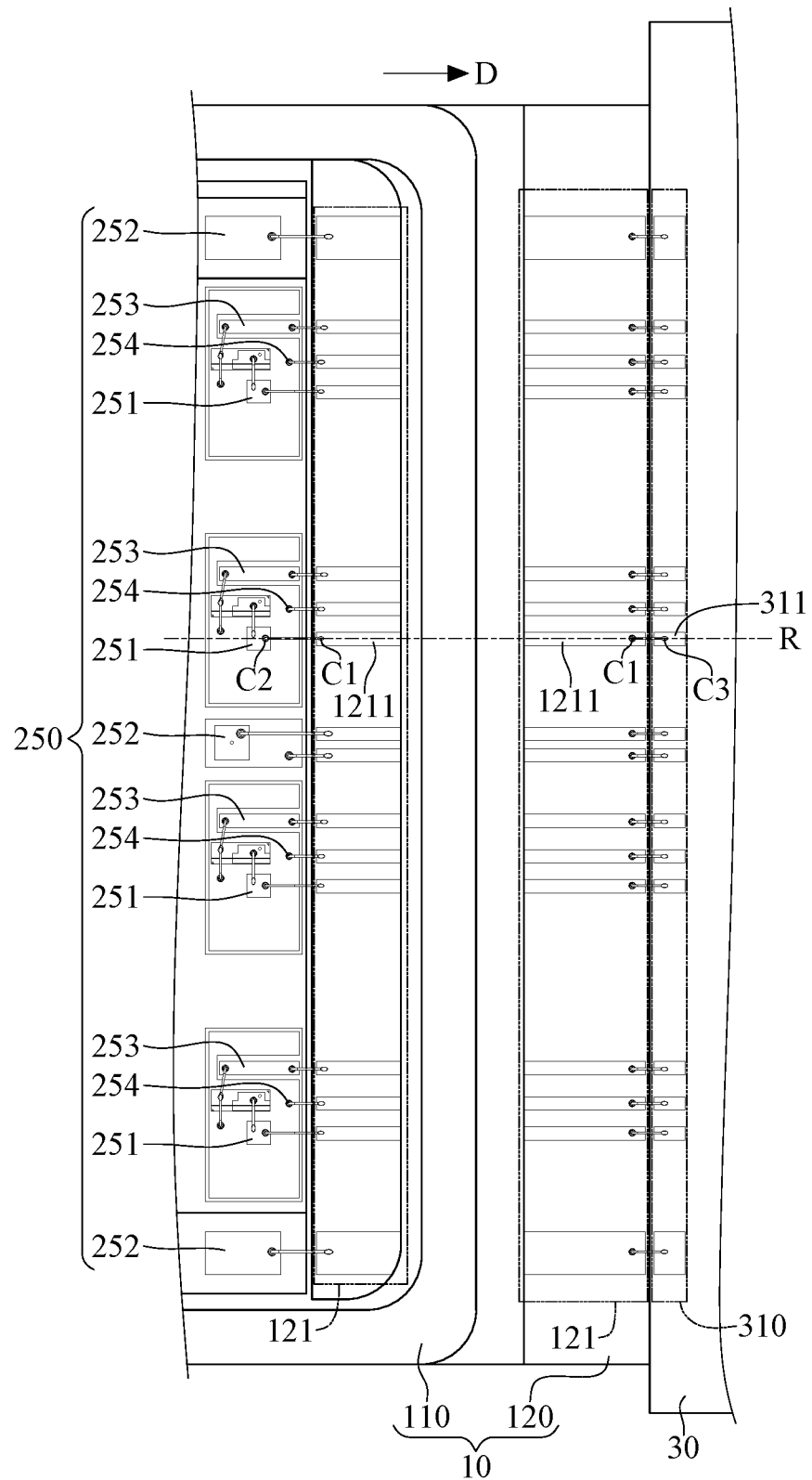
FIG. 8 is an enlarged view of part of the optical communication module in FIG. 7.

In FIG. 6, the adjacent electric interfaces 121 and 250 each has a first pin assignment. The adjacent electric interfaces 121 and 310 each has a second pin assignment, and the first pin assignment is different from the second pin assignment. For example, as shown in FIG. 6, a deviation in a vertical direction can be observed between any pin of the electric interface 121 or 250 at the left region of FIG. 6 and that of the electric interface 121 or 310 at the right region thereof. The positional or spatial arrangement of those pins could be referred to as the pin assignment. It is noted that the protective scope of the present disclosure is not limited to the pin assignment in FIG. 6. Please refer to FIG. 7 and FIG. 8, wherein FIG. 7 is a top view of an optical communication module according to still another embodiment of the present disclosure, and FIG. 8 is an enlarged view of part of the optical communication module in FIG. 7. In the present embodiment, the optical communication module 1c includes a main body 10, an optical communication assembly 20, and a circuit board 30. The main body 10 includes a housing 110 and a circuit board 120 disposed on the housing 110. The housing 110 is, for example but not limited to, a metal shell for package. A set of the housing 110 and the circuit board 120 together forms an airtight (hermetically sealing) cavity 103, and the circuit board 120 includes two electric interfaces 121. To better illustrate the disclosed content of the present disclosure, a part of the top of the housing 110 is omitted in FIG. 7 and FIG. 8 for showing the optical communication assembly 20 located in the main body 10.

The optical communication assembly 20 is accommodated in the airtight cavity 103 of the main body 10, and the optical communication assembly 20 includes a substrate 210, an optical communication element 220, a temperature controller 230, an optical modulator 240 and an electric interface 250. The substrate 210 is, for example but not limited to, a printed circuit board. The optical communication element 220 is disposed on an upper surface 211 of the substrate 210 and the optical communication element 220 may be a light emitting diode, a photodiode, a transmitter optical subassembly, receiver optical subassembly, or package thereof. The optical communication element 220 may be electrically connected to an integrated circuit chip (for example, digital signal processor not drawn here), and thus the optical communication element 220 may convert and output electric signals from the integrated circuit chip into corresponding optical signals, or receive and convert the optical signals into the corresponding electric signals through the integrated circuit chip. FIG. 7 shows that the optical communication assembly 20 includes a plurality of substrates 210 and a plurality of optical communication elements 220; however, it is noted that the protective scope of the present disclosure is not limited to the number of the substrates 210 and the number of the optical communication elements 220 in FIG. 7.

The temperature controller 230 is, for example but not limited to, a thermocouple temperature controller. The temperature controller 230 is accommodated in the airtight cavity 103 of the main body 10, and is in thermal contact with the substrate 210 of the optical communication assembly 20. More particularly, the temperature controller 230 is disposed between a lower surface 212 of the substrate 210 and a bottom inner wall surface 111 of the main body 10, and opposite sides of the temperature controller 230 are respectively in thermal contact with the lower surface 212 of the substrate 210 and the bottom inner wall surface 111 of the main body 10. In other words, the optical communication element 220 and the temperature controller 230 are respectively disposed on opposite surfaces of the substrate 210. The temperature controller 230 is to help control the working temperature inside the main body 10 within a certain range suitable for operation. The optical modulator 240 is disposed on the substrate 210 and is electrically connected to the optical communication element 220.

The electric interface 250, for example, may be a plurality of pins (such as conducting wires or metal contact pads) located on the substrate 210, the optical communication element 220 or the temperature controller 230 of the optical communication assembly 20. The electric interface 250 includes various types of pins such as optical communication element pin 251, temperature controller pin 252, modulator pin 253 and ground pin 254 (ground point located on the substrate 210). The optical communication element pin 251 and the ground pin 254 are connected to the optical communication element 220. The temperature controller pin 252 is connected to the temperature controller 230 and the modulator pin 253 is connected to the optical modulator 240. FIG. 8 shows multiple optical communication element pins 251, temperature controller pins 252, modulator pins 253, and ground pins 254. Similarly, it is noted that the protective scope of the present disclosure is not limited to the respective numbers of these types of pins and their relative positions.

The circuit board 30 has an electric interface 310 (third electric interface). One of the electric interfaces 121 of the circuit board 120 of the main body 10 is electrically connected to the electric interface 310 and the other electric interface 121 is electrically connected to the electric interface 250. The circuit board 30 may supply power to the optical communication element 220, the temperature controller 230 and the optical modulator 240 through the electric interface 121, the electric interface 250 and the electric interface 310.

Please refer to FIG. 8. In the present embodiment, the electric interfaces 121, 250 and 310 have the same pin assignment. More specifically, the same pin assignment refers to the same pin arrangement and pin pitch. The electric interface 250, from top to bottom, includes: the temperature controller pin 252, the modulator pin 253, the ground pin 254, the optical communication element pin 251, the modulator pin 253, the ground pin 254, the optical communication element pin 251, two temperature controller pins 252, the modulator pin 253, the ground pin 254, the optical communication element pin 251, the modulator pin 253, the ground pin 254, the optical communication element pin 251 and the temperature controller pin 252. The electric interfaces 121 and 310 have the same pin assignment as the electric interface 250, so that the pins of the electric interface 310 may correspond to the optical communication element pin 251, the temperature controller pin 252, the modulator pin 253 and the ground pin 254, respectively (pins of the electric interface 250).

In addition, the optical communication component 20, the circuit board 120 and the circuit board 30 are arranged in order along a direction D (horizontal direction) in FIG. 7 and FIG. 8, and the electrical interfaces 121, 250 and 310 are aligned in the direction D. For example, referring to one of the optical communication unit pins 251 of the electrical interface 250, both a pin 1211 of the electric interface 121 and a pin 311 of the electric interface 310 correspond to the optical communication element pin 251. The electric connection point C 1 of the pin 1211, the electric connection point C2 of the optical communication element pin 251 and the electric connection point C3 of the pin 311 are horizontally aligned along the direction D. As shown in FIG. 8, the electric connection points C1, C2 and C3 are all on a reference line R.

With the above configuration, the circuit board 30 provided to supply power to the optoelectronics is compatible with both hermetically sealing optical communication module 1c and the non-hermetically sealing optical communication module 1a, since the electric interface 310 of the circuit board 30 has the same pin assignment as the electric interface 250 of the optical communication component 20 (in other words, the pins of each electric interface are aligned in the direction D). The circuit board of the present disclosure could be used in hermetically sealing and non-hermetically sealing optical communication module, so that both modules could be fabricated on the same single production line.

The optical communication module 1c may be further equipped with other components. In this embodiment, the optical communication module 1c further includes an optical fiber adapter 40 and an optical isolator 50. The optical fiber adapter 40 is disposed on the housing 110 of the main body 10. The optical isolator 50 and the optical fiber adapter 40 couple with each other. When the optical communication element 220 includes the light emitting diode or the transmitter optical subassembly, the optical isolator 50 may restrict light generated by the light emitting diode to travel in a specific direction. When the optical communication element 220 includes photodiode or ROSA, the optical isolator 50 allows the optical communication element 220 to only receive light traveling in a specific direction.

Figure 9:
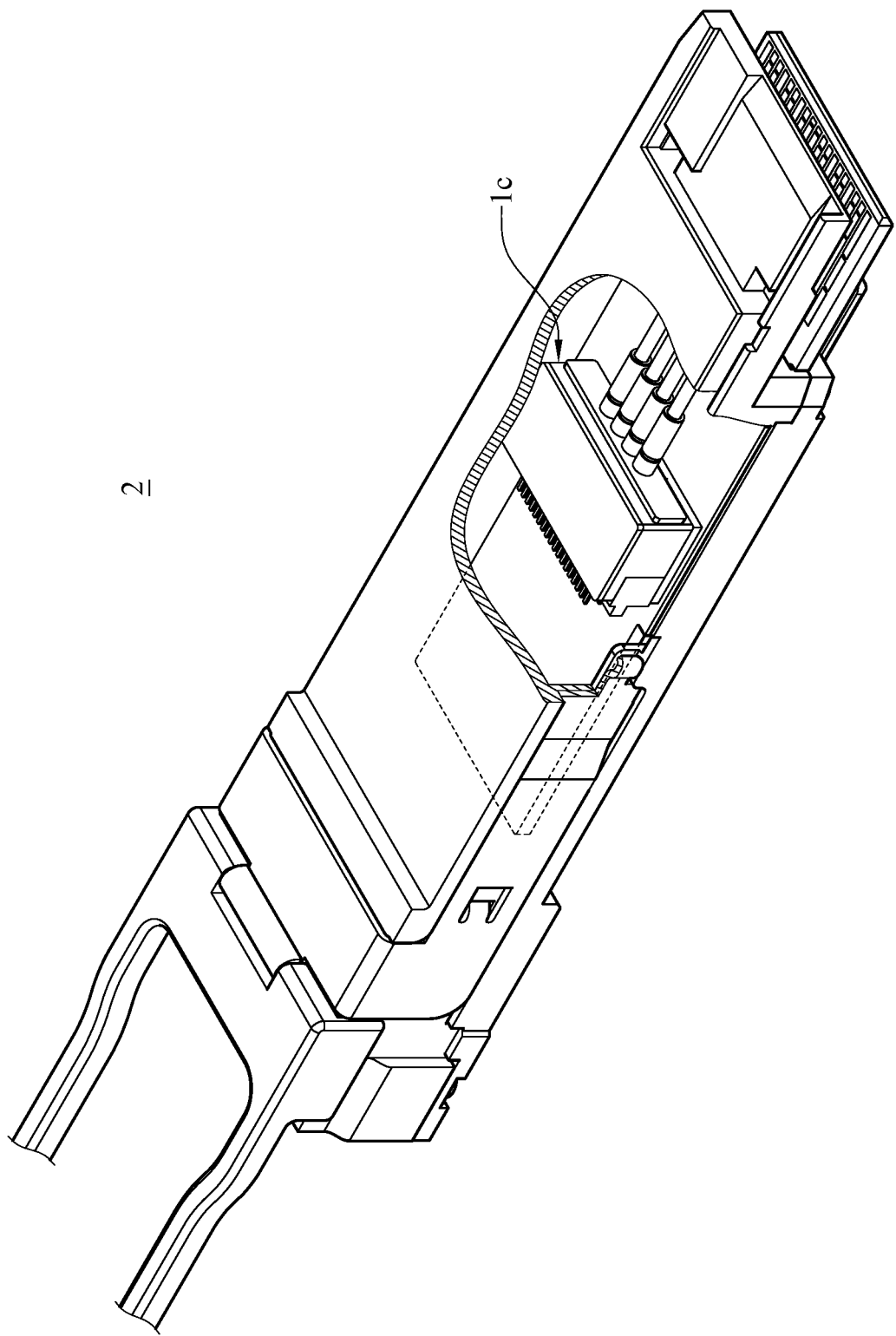
FIG. 9 is a perspective view of an optical transceiver according to an embodiment of the present disclosure.

FIG. 9 is a perspective view of an optical transceiver according to an embodiment of the present disclosure. In the present embodiment, the optical transceiver 2 includes a shell and an internal optical communication component. The internal optical communication component of the optical transceiver 2 may include the aforementioned optical communication module 1c.

According to the present disclosure, electric interfaces on different sides of the circuit board for supplying power to the internal optoelectronics have the same pin assignment as an electric interface of the optical communication component. In other words, the pins of each electric interface are aligned in an arrangement direction. Since the circuit board of the present disclosure could be used in both airtight packaging and non-airtight packaging for optical communication module, the airtight packaged optical communication module and non-airtight packaged optical communication module could be fabricated on single production line. As to the airtight packaging, the optical communication assembly is electrically connected to a pin for power supply on the circuit board indirectly through a metal circuit layer on another circuit board. As to the non-airtight packaging, the optical communication component is directly electrically connected to a pin for power supply on the circuit board. The compatibility of the circuit board is helpful to integrate airtight packaging process and non-airtight packaging process into single production line, thereby reducing manufacturing costs.

What is claimed is:

1. An optical communication module, comprising:
a main body having an airtight cavity, wherein the main body comprises a housing and a first circuit board disposed on the housing, the housing and the first circuit board forms the airtight cavity, and the first circuit board comprises two first electric interfaces;
an optical communication assembly accommodated in the airtight cavity, wherein the optical communication assembly comprises:
a substrate;
an optical communication element disposed on the substrate; and
a second electric interface, wherein one of the two first electric interfaces of the first circuit board is electrically connected to the second electric interface; and
a second circuit board comprising a third electric interface, wherein the other one of the two first electric interfaces of the main body is electrically connected to the third electric interface;
wherein the optical communication assembly, the first circuit board and the second circuit board are sequentially arranged in a direction, and the two first electric interfaces, the second electric interface and the third electric interface are aligned in the direction;
wherein the second electric interface has a first plurality of pins and the third electric interface has a second plurality of pins, and the first plurality of pins and the second plurality of pins have a same pin assignment, wherein the same pin assignment comprises a same pin arrangement and a same pin pitch.

2. The optical communication module according to claim 1, wherein the two first electric interfaces, the second electric interface and the third electric interface have same pin assignment.

3. The optical communication module according to claim 1, wherein the optical communication element further comprises a thermoelectric temperature controller, the thermoelectric temperature controller is in contact with the substrate, and the third electric interface comprises a pin corresponding to the thermoelectric temperature controller.

4. The optical communication module according to claim 1, wherein the substrate has a ground point, and the third electric interface comprises a pin corresponding to the ground point.

5. The optical communication module according to claim 1, wherein the optical communication assembly further comprises an optical modulator, and the third electric interface comprises a pin corresponding to the optical modulator.

6. The optical communication module according to claim 1, further comprising an optical fiber adapter disposed on the housing of the main body.

7. The optical communication module according to claim 6, further comprising an optical isolator accommodated in the main body, and the optical isolator and the optical fiber adapter coupled with each other.

8. The optical communication module according to claim 1, wherein the first circuit board is a ceramic circuit board.

9. An optical transceiver, comprising the optical communication module according to claim 1.

10. An optical communication module, comprising:
a main body comprising a housing and a first circuit board disposed on the housing, wherein the housing and the first circuit board together form an airtight cavity of the main body, and the first circuit board comprises two first electric interfaces;
an optical communication assembly accommodated in the airtight cavity, wherein the optical communication assembly comprises a second electric interface, one of the two first electric interface of the first circuit board is electrically connected to the second electric interface; and
a second circuit board comprising a third electric interface, wherein the other one of the two first electric interfaces of the main body is electrically connected to the third electric interface;
wherein the optical communication assembly, the first circuit board and the second circuit board are sequentially arranged in a direction, and the second electric interface has a first plurality of pins and the third electric interface has a second plurality of pins, and the first plurality of pins and the second plurality of pins have a same pin assignment, wherein the same pin assignment comprises a same pin arrangement and a same pin pitch.

* * * * *